United States Patent [19]

Galbraith et al.

[11] Patent Number: 5,299,150
[45] Date of Patent: Mar. 29, 1994

[54] CIRCUIT FOR PREVENTING FALSE PROGRAMMING OF ANTI-FUSE ELEMENTS

[75] Inventors: Douglas C. Galbraith, Fremont; Michael G. Ahrens, Sunnyvale; Esmat Z. Hamdy, Fremont; Abdelshafy A. Eltoukhy, San Jose, all of Calif.

[73] Assignee: Actel Corporation, Sunnyvale, Calif.

[21] Appl. No.: 295,403

[22] Filed: Jan. 10, 1989

[51] Int. Cl.[5] .................. G11C 17/16; H01L 27/02; G06F 7/38; H03K 19/173
[52] U.S. Cl. .................. 365/94; 365/96; 365/129; 365/174; 307/465; 257/528
[58] Field of Search .................. 365/96, 189.06, 225.7, 365/174, 103, 104, 105, 230.06, 129

[56] References Cited

U.S. PATENT DOCUMENTS

| | | | |
|---|---|---|---|
| 3,582,908 | 6/1971 | Koo | 365/96 |
| 4,122,540 | 10/1978 | Russell et al. | 365/104 |
| 4,322,822 | 3/1982 | McPherson | 365/103 |
| 4,347,586 | 8/1982 | Natsui | 365/189.06 |
| 4,462,088 | 7/1984 | Giuliani et al. | 365/105 |
| 4,507,757 | 3/1985 | McElroy | 365/104 |
| 4,569,120 | 2/1986 | Stacy et al. | 365/105 |
| 4,569,121 | 2/1986 | Lim et al. | 365/105 |
| 4,723,225 | 2/1988 | Kaszubinski | 365/203 |
| 4,823,181 | 4/1989 | Mohsen et al. | 357/51 |
| 4,873,459 | 10/1989 | El Gamal et al. | 307/465 |
| 4,881,114 | 11/1989 | Mohsen et al. | 357/51 |
| 4,899,205 | 2/1990 | Hamdy et al. | 357/51 |
| 4,910,417 | 3/1990 | El Gamal et al. | 307/465 |

OTHER PUBLICATIONS

Fink et al., *Electronic Engineer's Handbook*, pp. 16–16 to 16–19.
Richman, "Characteristics & Operation of MOS Field Effect Devices," pp. 116–118, 1967.

*Primary Examiner*—Stuart N. Hecker
*Assistant Examiner*—Michael A. Whitfield
*Attorney, Agent, or Firm*—Kenneth D'Alessandro

[57] ABSTRACT

A circuit for preventing false programming of unselected anti-fuses in an anti-fuse array includes a series impedance including a plurality of transistors which may be used for partial address selection connected between a source of programming voltage and a bit line.

2 Claims, 1 Drawing Sheet

CIRCUIT FOR PREVENTING FALSE PROGRAMMING OF ANTI-FUSE ELEMENTS

BACKGROUND OF THE INVENTION

1. Field Of The Invention

The present invention relates to electronic circuitry. More particularly, the present invention relates to circuitry for programming an array of anti-fuses, and for preventing false programming of anti-fuses in an array of anti-fuses.

2. The Prior Art

The anti-fuse structure is similar to a capacitor; it contains an insulating material sandwiched between two conductors. For example, see application Ser. No. 861,519, Filed May 9, 1986, now U.S. Pat. No. 4,823,181 to Mohsen et al., assigned to the same assignee as the present invention. An anti-fuse may be programmed by applying a high voltage across the insulator until it ruptures, thereby shorting the two conductors together. The resistance of the ruptured anti-fuse is decreased by passing high current through it for an extended period of time. The period of voltage stressing is often called the stress time, and the period during which high current is allowed to flow is often called the soak time.

Anti-fuses may be used as a Programmable Read Only Memory (PROM) cell elements and may be placed in a PROM array. Some MOS anti-fuse memory PROM array circuits have reliability problems because the designs in which they reside have been implemented without taking into account the effects of substrate current and the parasitic bipolar devices in MOS circuits. The substrate current at issue is due to avalanching in the pinch off region of the MOS device. The parasitic bipolar device is composed of two or more like polarity diffusions separated by material of opposite polarity. For example, the drain and source diffusions of an MOS device are potentially the collector and emitter of a parasitic bipolar device whose base is either the substrate or the well in the substrate containing those diffusions.

If the substrate current is large enough, it can forward bias the base emitter junction of the parasitic bipolar device, thus turning it on. This parasitic device multiplies the substrate current by the beta of the bipolar transistor. A bata greater than 100 is possible, so a small substrate current can produce a large bipolar current.

A bipolar device may have multiple collectors. Therefore, one forward biased junction can draw collector current through numerous nearby junctions. These multiple collectors may cause reliability problems. For example, when one of a group of adjacent anti-fuse memory cells is being programmed, if the parasitic bipolar device associated with one memory cell is turned on during the soak time, a current path via one of these parasitic multiple collectors may cause sufficient stress voltage across the adjacent unselected anti-fuses to rupture one or more of them and thus falsely program one or more of them.

BRIEF DESCRIPTION OF THE INVENTION

Two approaches to reducing the amount of time that the anti-fuses are stressed are employed in the present invention. First, when the selected anti-fuse ruptures, a circuit immediately drops the stress voltage to a value which will not harm the unselected anti-fuses. Second, the operating device characteristics of the circuit are adjusted to reduce the amount of time that the parasitic bipolar device remains active.

A presently-preferred embodiment of the instant invention includes a node to which a programming voltage may be applied, an impedance element interposed between that node and an internal programming bus to which anti-fuses may be connected, directly or indirectly. In a presently-preferred embodiment, the impedance may be one or more MOS transistors connected in series with the programming voltage node. These transistors may also act as addressing elements to partially or entirely select location to both program and read. A plurality of memory cells, each memory cell including an anti-fuse element in series with an MOS select transistor, are located downstream of the impedance element. The source connections of the MOS select transistors are connected to a source of a fixed voltage which may be selected to provide source bias.

DETAILED DESCRIPTION OF A PREFERRED EMBODIMENT

Figure 1:
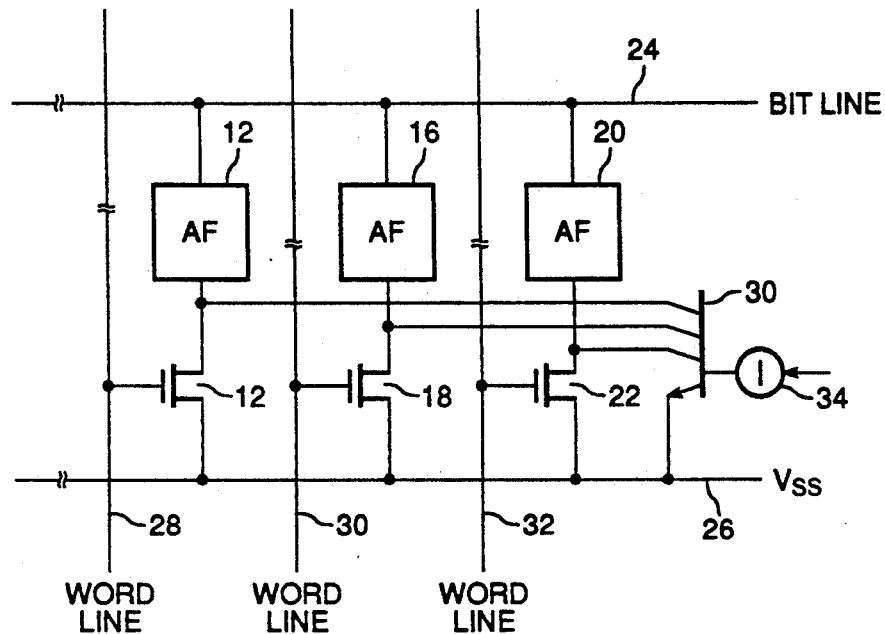
FIG. 1 is a schematic diagram of a portion of a typical prior art anti-fuse array showing an arrangement for programming an array of anti-fuses showing a typical multicollector parasitic bipolar device inherently formed with the circuit.

In order to best understand the present invention, an understanding of the mechanisms by which typical prior art arrangements fail is helpful. Referring first to FIG. 1, a schematic diagram of a portion of an anti-fuse array built according to the prior art techniques is shown. The circuit includes a first anti-fuse 12, connected in series with the drain of a select device 14, a second anti-fuse 16, connected in series with the drain of its select device 18, and a third anti-fuse device 20, connected in series with the drain of its select device 22. The top ends of anti-fuses 12, 16, and 20 are commonly connected to a bit line 24.

The sources of N-channel select devices 14, 18, and 22 are commonly connected to a fixed voltage 26 (shown as $V_{ss}$ in FIG. 1). Word lines 28, 30, and 32 are connected to the gates of select devices 14, 18, and 22 respectively. Those of ordinary skill in the art will readily recognize that word lines 28, 30, and 32 will be connected to the gates of other select devices in the array depending on the size and geometry of the array and that other work lines will be connected to other groups of anti-fuses. Those of ordinary skill in the art will also realize that in a normal array $V_{ss}$ line 26 and bit line 24 will extend over a greater number of devices, depending on the size of the array. A typical array will have a plurality of bit lines, each bit line connected to a different group of anti-fuses.

Those familiar with MOS circuits will readily recognize that select devices 14, 18, and 22 each comprise a diffused source and drain area located either in a well or directly in the substrate. The formation Of transistors 14, 18, and 22 will inherently result in the formation of a number of parasitic NPN transistors. For instance, a parasitic NPN transistor 34 is shown having its emitter common to the source connection of transistor 22, and its base common to the substrate or well in which transistors 14, 18, and 22 are formed. Parasitic NPN transistor 34 is a multicollector transistor, having as its multiple collectors the drains of N-channel transistors 14, 18, and 22. Those of ordinary skill in the art will readily realize that, in the schematic of FIG. 1, there are actually three such parasitic NPN transistors, one associated with each of N-channel transistors 14, 18, and 22, each parasitic bipolar NPN transistor having the same three collectors.

The failure mechanism associated with the programming of the anti-fuses in the prior art circuit of FIG. 1 can easily be seen. If it is assumed that parasitic bipolar NPN transistor 30 is associated with select device 22, the programming of anti-fuse 20 can be seen to cause conditions which could easily result in the false programming of either anti-fuse 12 or anti-fuse 16 or both of them.

When it is desired to program anti-fuse 20, bit line 24 is raised to a programming voltage $V_{pp}$ and word line 32 is brought to $V_{pp}$. Under these conditions, N-channel select device 22 conducts. Word lines 28, and 30 are kept at ground, thus keeping N-channel select devices 14 and 18 in an off state. During this stress time, the programming voltage $V_{pp}$ is applied the dielectric and anti-fuse 20 is being stressed by the voltage across it. Once the dielectric of the anti-fuse 20 is ruptured, a complete D.C. current path is formed between bit line 24 and $V_{ss}$ line 26 through select device 22. When this dielectric ruptures, the drain of select device 22 is momentarily raised to a voltage near that of the voltage on bit line 24. When the drain of select device 22 is raised to a voltage greater than about 10 volts, this causes a phenomenon known as avalanching to occur within the pinch off region of the N-channel device. This causes electrons to be injected into the substrate. A current I, shown at reference numeral 36, is thus injected into the substrate, and hence into the base of parasitic transistor 34, thus turning it on. Since parasitic bipolar NPN transistor 30 is turned on, there is a current path between drains of N-channel select devices 14 and 18, at the lower ends of anti-fuses 12 and 16 (two of the multiple collectors of the parasitic NPN transistor 30), to $V_{ss}$ line 26, even though select devices 14 and 18 remain in their off state. Because of this connection, sufficient stress may exist across either of anti-fuses 12 or 16 or both of them, to inadvertently program either or both of them.

Figure 2:
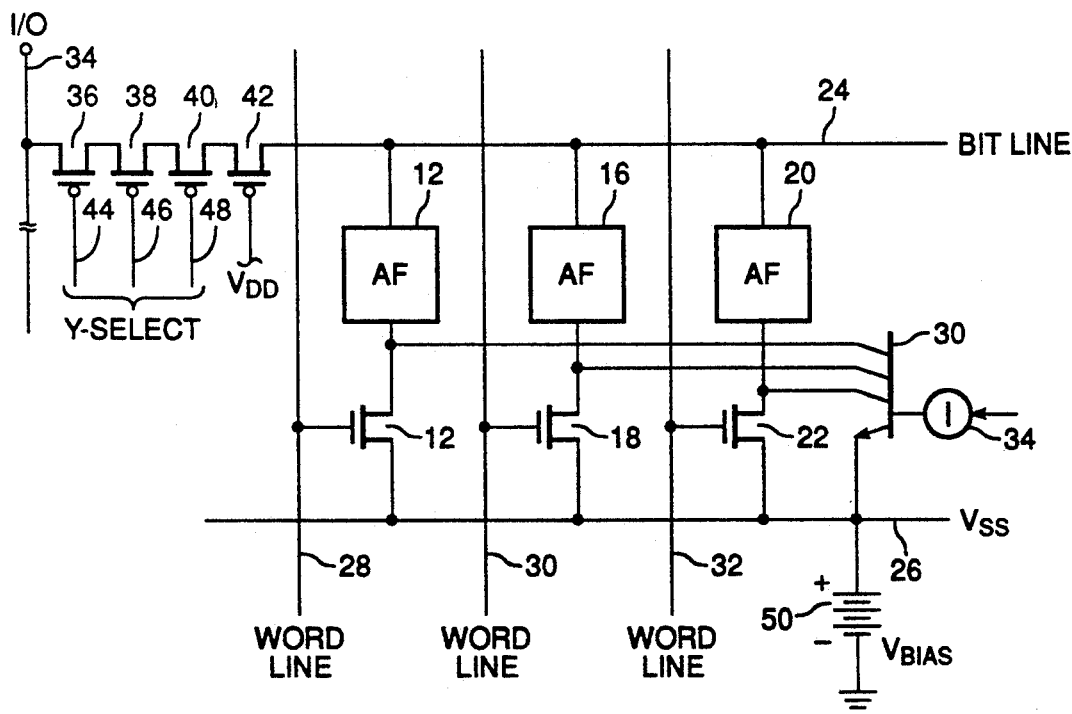
FIG. 2 is a schematic diagram of a portion of an anti-fuse array according to the present invention showing the circuitry for preventing false programming.

Referring now to FIG. 2, a presently-preferred embodiment of the present invention includes circuitry which prevents the false programming of anti-fuses which are not intended to be programmed. As in the circuit of FIG. 1, anti-fuse 12 is in series with N-channel select device 14, anti-fuse 16 is in series with N-channel select device 18 and anti-fuse 20 is in series with N-channel select device 22. The top ends of anti-fuses 12, 16, and 20 are commonly connected to bit line 24. The source connections of N-channel select transistors 14, 18, and 22 are commonly connected to $V_{ss}$ line 26. Word line 28 is connected to the gate of N-channel select device 14, word line 30 is connected to the gate of N-channel select device 18, and word line 32 is connected to the gate of N-channel select device 22. As will be apparent to those of ordinary skill in the art, the circuit configuration of FIG. 2 is useful as a Read only memory (ROM). While the present invention is disclosed using the ROM example, the invention is applicable to other circuits, and those skilled in the art will understand how to apply the invention to other circuits from the disclosure herein. Those of ordinary skill in the art will also recognize that the number of word lines and the number of bit lines will vary with the size and organization of the array containing the anti-fuses. Bit line 24 is connected to I/O line 34 via 4 P-channel transistors, 38, 40, 42 and 44 which together comprise an impedance element. P-channel transistor 38 has its source connected to I/O line 34 and its drain connected to the source of P-channel transistor 40. P-channel transistor 40 has its drain connected to the source of P-channel transistor 42. P-channel transistor 42 has its drain connected to the source of P-channel transistor 44. The drain of P-channel transistor 44 is connected to bit line 24. The gates of P-channel transistors 38, 40 and 42 respectively, are connected to Y-select lines 48, 50 and 52 respectively. Those of ordinary skill in the art will recognize that Y-select lines 48, 50 and 52 can form either partial or complete addressing of the anti-fuse ROM array of FIG. 2.

P-channel transistor 44, has its gate connected to $V_{dd}$. P-channel transistor 44 is thus connected as a high voltage protection device for P-channel transistors 38, 40 and 42. If P-channel transistors 38, 40 and 42 are fabricated using a process which result in devices which cannot have more than 16 volts placed across their source/drain terminals P-channel transistor 44 protects theses devices by assuring that its source cannot go any lower than 6 volts, when its gate is connected to a $V_{dd}$ of 5 volts. In such a case, a programming voltage $V_{pp}$ of 20 volts will result in a voltage of only 14 volts across all three of P-channel transistors 38, 40 and 42, thus protecting them against breakdown.

P-channel transistors 38, 40, 42 and 44 are relatively weak transistors. For example, in a presently-preferred embodiment their size may be about 50 $\mu$/2.8 $\mu$, thus making their series P-channel combination a little weaker than the N-channel memory cell of 9 $\mu$/2.0 $\mu$.

By making these transistors weak devices, two objectives are achieved. First, decoding of the programming voltages and output voltages of the memory array are achieved, and, in addition the breakdown mechanism which plagues the circuit of FIG. 1 is eliminated. Assuming again with respect to FIG. 2, that it is desired to program anti-fuse 20, a high voltage $V_{pp}$ is placed on word line 32, Y-select lines 48, 50 and 52 are brought to a low voltage. $V_{pp}$ is placed on I/O line 46 thus causing the voltage of $V_{pp}$ on bit line 24. Since N-channel select transistor 22 is turned on, there is a complete path between $V_{pp}$ on I/O line 46 and $V_{ss}$ line 26. The electric field across the anti-fuse stresses the anti-fuse and finally ruptures the dielectric.

At the moment that the dielectric ruptures the drain of N-channel select transistor 22 rises to approximately the voltage at bit line 24 thus turning on parasitic NPN transistor 34. The high bipolar current through parasitic NPN transistor 34 rapidly discharges the bit line capacitance and lowers the bit line voltage to a point where the drain voltage is not sufficient to keep the bipolar device on. The bit line voltage continues to drop until it stabilizes at a value equal to the programming voltage minus the soak current multiplied by the bit line Y-select device resistance.

The IR drop caused by the soak current and the combined Y-select device resistance lowers the bit line voltage to a value under the minimum stress voltage for the unprogrammed anti-fuses. Initially after rupture, the bipolar transistor of the selected cell may begin discharging some adjacent floating nodes and stress their anti-fuses. However, the bit line voltage simultaneously begins dropping, thereby reducing the voltage across the adjacent anti-fuses so that they are only stressed momentarily, perhaps for a time on the order of 10 nanoseconds.

To increase reliability even further, the gate to source voltage on the unselected N-channel select transistors should be biased negatively so that noise does not inadvertently drive a select device to subthreshold conduction. This conduction could discharge an unselected floating node and rupture and/or stress any unselected anti-fuses.

Source biasing may be accomplished in the example shown in FIG. 2, by, for instance, raising $V_{ss}$ one volt by use of a voltage source, as shown schematically by battery 50 suppling $V_{bias}$. Those of ordinary skill in the art will recognize that $V_{bias}$ may be from approximately 0.5 to 2 v. Raising Vss (this is called source biasing) also increases the maximum drain voltage needed to turn on the parasitic NPN device. As long as the source diffusion is the only junction within the silicon region of interest (for example, a memory array), then source biasing reverse biases the base emitter junction of the parasitic NPN device. Therefore, greater substrate current is necessary to turn on the NPN device, since this current must first cause a substrate voltage drop large enough to overcome the source bias before it can turn on the NPN device. Source biasing further reduces the voltage range over which the NPN device is active, and hence the amount of time that collector current is drain from a floating anti-fuse node.

Another technique for reducing the voltage range in which the parasitic NPN is active is to raise the word line (gate of the select N-channel device) before applying high voltage to the anti-fuse (effectively the drain of the select n-channel device). The amount of current that is injected from the drain into the substrate (the base current of the parasitic NPN device) is affected by the gate voltage, since the gate voltage modifies the electric field around the drain. The maximum substrate current typically occurs when the gate to substrate voltage is between two to four volts. Above four volts, the substrate current decreases. Applying the maximum voltage to the gate prior to applying voltage to the drain minimizes the amount of current (charge) injected into the substrate when the anti-fuse ruptures.

The reading of the memory array disclosed herein is accomplished in the normal manner. I/O line 46 (FIG. 2), is brought to $V_{dd}$ and the desired memory cell is addresssed. If the anti-fuse has been ruptured, I/O line 46 will be brought to a logic low level when the select transistor is turned on by the appropriate signal on its word line. If, however, the anti-fuse has not been ruptured, I/O line 46 will remain at $V_{dd}$.

While a presently-preferred embodiment of the invention has been disclosed, those of ordinary skill in the art will, from an examination of the within disclosure and drawings be able to configure other embodiments of the invention. These other embodiments are intended to fall within the scope of the present invention which is to be limited only by the scope of the appended claims.

What is claimed is:

1. A read only memory array, including:
   a plurality of two terminal anti-fuse elements, said two terminal anti-fuse elements being arranged in groups, each of said groups containing a number of said plurality of two terminal anti-fuse elements, have one terminal connected in common to a bit line,
   a plurality of select transistors associated with each group of two terminal anti-fuse elements, each of said plurality of select transistors having a source, a drain, and a gate, the individual ones of said plurality of select transistors associated with each group having their sources commonly connected to a source of fixed voltage, said fixed voltage selected to between about 0.5 and 2 volts above ground, each one of said plurality of select transistors having its drain connected to the second terminal of a different two terminal anti-fuse element of said group of two terminal anti-fuse elements, and each one of said plurality of select transistors having its gate connected to one of a plurality of word lines,
   a plurality of transistors connected in series between said bit line and an input/output line, each of said plurality of transistors having a gate coupled to a different one of a plurality of Y-select lines.

2. The read only memory of claim 1 wherein said plurality of transistors comprises a plurality of P-channel MOS transistors having their sources and drains connected in series between said input/output line and said bit line, respective gate of each of said plurality of P-channel MOS transistors connected to a different one of said plurality of Y-select lines.

* * * * *

UNITED STATES PATENT AND TRADEMARK OFFICE
CERTIFICATE OF CORRECTION

PATENT NO. : 5,299,150

DATED : March 29, 1994

INVENTOR(S) : Douglas C. Galbraith, et al.

It is certified that error appears in the above-identified patent and that said Letters Patent is hereby corrected as shown below:

Col. 1, line 47, change "bata" to --beta--.

Signed and Sealed this

Twenty-seventh Day of September, 1994

Attest:

BRUCE LEHMAN

Attesting Officer

*Commissioner of Patents and Trademarks*